US011313906B2

United States Patent
Bezzam et al.

(10) Patent No.: US 11,313,906 B2
(45) Date of Patent: Apr. 26, 2022

(54) AUTO-CALIBRATION CIRCUIT FOR PULSE GENERATING CIRCUIT USED IN RESONATING CIRCUITS

(71) Applicant: Rezonent Microchips Pvt. Ltd., Thrissur (IN)

(72) Inventors: Ignatius Bezzam, Thrissur (IN); Neelam Rawat, Bangalore (IN)

(73) Assignee: Rezonent Microchips Pvt. Ltd., Thrissur (IN)

( * ) Notice: Subject to any disclaimer, the term of this patent is extended or adjusted under 35 U.S.C. 154(b) by 0 days.

(21) Appl. No.: 16/982,566

(22) PCT Filed: Mar. 20, 2019

(86) PCT No.: PCT/IN2019/050230
§ 371 (c)(1),
(2) Date: Sep. 20, 2020

(87) PCT Pub. No.: WO2019/180744
PCT Pub. Date: Sep. 26, 2019

(65) Prior Publication Data
US 2021/0011084 A1    Jan. 14, 2021

(30) Foreign Application Priority Data
Mar. 20, 2018    (IN) .............................. 101841010131

(51) Int. Cl.
*G01R 31/317*    (2006.01)
*H03K 5/07*    (2006.01)

(52) U.S. Cl.
CPC ......... *G01R 31/31726* (2013.01); *H03K 5/07* (2013.01)

(58) Field of Classification Search
CPC ........................... G01R 31/31726; H03K 5/07
USPC ........................................................ 714/700
See application file for complete search history.

(56) References Cited

U.S. PATENT DOCUMENTS

| 5,406,590 | A  | * | 4/1995 | Miller | ................... | H03L 7/0891 |
|           |    |   |        |        |                     | 327/159 |
| 6,956,908 | B2 | * | 10/2005 | Forbes | ............... | H03K 5/15013 |
|           |    |   |        |        |                    | 327/141 |
| 8,108,738 | B2 | * | 1/2012 | Gara | ................... | G06F 13/1689 |
|           |    |   |        |       |                     | 714/700 |
| 8,350,577 | B1 | * | 1/2013 | Ecker | ................... | G01R 35/005 |
|           |    |   |        |        |                     | 324/601 |

(Continued)

OTHER PUBLICATIONS

C. H. Kim, S. Hsu, R. Krishnamurthy, S. Borkarand K. Roy, "Self calibrating circuit design for variation tolerant VLSI systems," 11th IEEE International On-Line Testing Symposium, 2005, pp. 100-105.*

(Continued)

*Primary Examiner* — Steve N Nguyen

(57) ABSTRACT

Disclosed is an auto-calibration circuit and method to generate the precise pulses that are required for energy savings achieved by using wide-band resonating cells for digital circuits. The calibration circuit performs a calibration technique by programming the number of PMOS devices and NMOS devices in parallel to an inverter, and these numbers are dynamically changed based on a target reference voltage that is defined by a resistance ratio or any PVT-independent reference voltages could also be set as a target voltage level.

10 Claims, 6 Drawing Sheets

(56) References Cited

U.S. PATENT DOCUMENTS

| | | | |
|---|---|---|---|
| 2009/0074120 A1* | 3/2009 | Toosky | H03H 11/1291 375/350 |
| 2009/0146700 A1* | 6/2009 | Kim | H03L 7/07 327/144 |
| 2014/0375332 A1* | 12/2014 | Michal | G01R 19/16538 324/537 |
| 2018/0062548 A1* | 3/2018 | Ikenaga | H02P 6/153 |

OTHER PUBLICATIONS

C. Frost, G. Levy and B. Allison, "A self-calibrating bandpass filter and transceiver system tuning and test technique," Proceedings of the 20th IEEE Instrumentation Technology Conference (Cat. No. 03CH37412), 2003, pp. 1317-1321.*

* cited by examiner

AUTO-CALIBRATION CIRCUIT FOR PULSE GENERATING CIRCUIT USED IN RESONATING CIRCUITS

BACKGROUND

Technical Field

The embodiments herein generally relate to a circuit for improving timing performance and timing closure in digital circuits, and, more particularly, to an auto-calibration circuit that controls the metal oxide semiconductors (MOS) present in a digital circuit to produce required calibration.

Description of the Related Art

With the development of integrated circuitry and, in particular, MOS/VLSI technology in combination with more circuitry on a chip, there is a standing and ever-increasing desire to be able to provide complete digital on-chip self-calibrated timing and clocking of signals employed in such circuitry.

Presently, signal timing or desired clock generation is provided by off-chip or separate or discrete integrated circuitry utilizing various conventional techniques for such generation schemes, such as one-shot multivibrators, phase locked loop (PLL) arrangements and discrete signal and clock generation provided in bipolar technology. In these cases, some analog arrangement is made to check the timing or clocking period to determine that it is continually correct. Such checking is done periodically so that it may or may not be continuously accurate. As a result, timing or clocking may not always be accurate in circuit utilization, resulting in malfunctioning or loss of data. What is desired is clocking and timing circuitry that is on-chip with the integrated circuitry and is somehow self-calibrated to continuously maintain timing accuracy.

If one depends on analog values in on-chip clocking and timing, many problems are encountered because of changes that occur in physical and electrical properties in the successive processing of wafers. Uniformity in clock and signal timing generation from wafer to wafer is crucial where precise product specifications must be met and if clocking and signal timing generation properties must depend upon fabricated circuit parameters, uniformity in those properties from batch processing is next to impossible in MOS technology, e.g., NMOS. Presently, complex timing interface circuitry is employed to provide clocking and timing signals and means to verify the accuracy of such signals before applying them to perform their designated regulatory functioning. However, there is not a presently realizable methodology as to how to implement their functioning in MOS/VLSI technology, e.g., NMOS with verified accuracy and know precisely when the time occurrence of a signal transitional edge will occur and what the resolution will be between transitional edge occurrences in NMOS implemented clocking and timing.

Accordingly, there remains a need for an auto-calibration circuit for improving timing performance and timing closure in digital circuits.

SUMMARY

The present disclosure provides an auto-calibration circuit for calibrating a circuit fabricated on Metal-Oxide Semiconductors (MOS) technology providing required calibration to improve the performance of the circuit. The auto-calibration circuit includes an inverter block, one or more gated inverters, a first comparator, a NMOS gate, a second comparator, a PMOS counter and a NMOS counter. The inverter block includes a P-type Metal Oxide Semiconductor (PMOS) and a N-type Metal Oxide Semiconductor (NMOS). The one or more gated inverters obtains first inputs $B_n$ and $B_p$ from Digital Memory Counters of the circuit. The one or more gated inverters (304A-304N) include a plurality of PMOS and a plurality of NMOS. The first comparator that is connected with the one or more gated inverters that obtains a second input from at least one of the inverter block or the one or more gated inverters. The NMOS gate that is connected with a capacitor and an XOR gate to charge the capacitor using a XOR signal (n1x) from the XOR gate. The XOR gate generates the XOR signal when the XOR gate is connected with the first comparator. The second comparator that obtains input from at least one of a voltage divider or a capacitor. The PMOS counter that increases the count values when output values of the second comparator and the XOR gate are high. The count values of the PMOS counter enables the plurality of PMOS of the one or more gated inverters. The NMOS counter that increases the count values when the output value of the second comparator is low and the output value of the XOR gate is high. The count values of the NMOS counter enables the plurality of NMOS of the one or more gated inverters to provide required calibration to the circuit.

In an embodiment, the plurality of PMOS is connected with the inverter block when the input $B_p$ is high.

In another embodiment, the plurality of NMOS is connected with the inverter block when the input $B_n$ is high.

In yet another embodiment, a voltage divider includes a first resistor and a second resistor. The ratio between the first resistor and the second resistor is selected based on a threshold voltage which is used to provide the required calibration.

In yet another embodiment, the one or more gated inverters includes a NOT, a NOR gate, a NAND gate, a gated PMOS and a gated NMOS, The one or more inverter obtains the first input $B_p$ using the NOT gate and the first input $B_n$ using the NAND gate.

In yet another embodiment, the one or more gated inverters connected with the inverter block.

In yet another embodiment, the capacitor samples the input voltage when the XOR signal is high.

In yet another embodiment, the second comparator generates a second comparator output (nvx) and the XOR gate generates the XOR signal. The PMOS counter and the NMOS counter increases the count-up value when the XOR signal and the second comparator output is high, wherein the PMOS counter and the NMOS counter increases the count-down value when the XOR signal is high and the second comparator output is low.

In another aspect, a method for calibrating the pulse widths of a pulse generator circuit using auto-calibration circuit includes (a) generating a pulse to turn on a NMOS switch using a first comparator, (b) allowing a capacitor to charge based on an input signal using the NMOS switch, (c) generating a second comparator output (nvx) based on the input received from the capacitor and a resistance divider using a second comparator and (d) generating control bits using one or more gated inverters for calibrating the pulse widths of a pulse generator.

In an embodiment, the method includes (a) generating a XOR signal using the XOR gate, (b) increasing a count-up value when the XOR signal and the second comparator output is high using a PMOS counter and a NMOS counter and (c) increasing a count-down value when the XOR signal is high and the second comparator output is low using a PMOS counter and a NMOS counter.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiment herein will be better understood from the following detailed description with the drawings, in which.

BRIEF DESCRIPTION OF THE DRAWINGS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Figure 1:
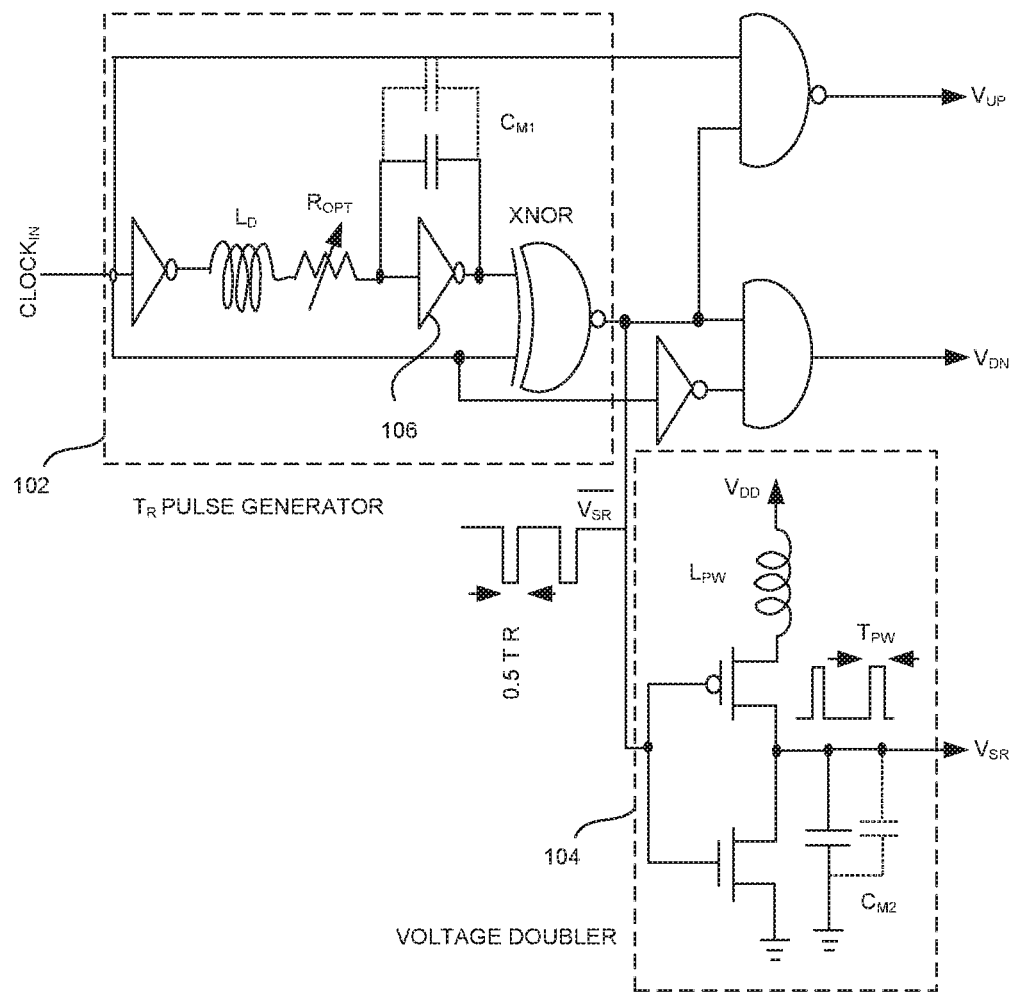
FIG. 1 illustrates a pulse generator circuit that is auto-calibrated to generate the precise pulses that are required for energy savings in the digital circuits according to an embodiment herein.

FIG. 1 illustrates a pulse generator circuit 102 that is auto-calibrated to generate the precise pulses that are required for energy savings in the digital circuits according to an embodiment herein. The pulse generator circuit 102 is connected to a voltage doubler 104. The pulse generator circuit 102 comprises inverter 106, a delay inductance, a transmission gate, a matched capacitance and an exclusive OR (XOR) gate. The transmission gate comprises PMOS transistor and NMOS transistor in parallel.

Figure 2:
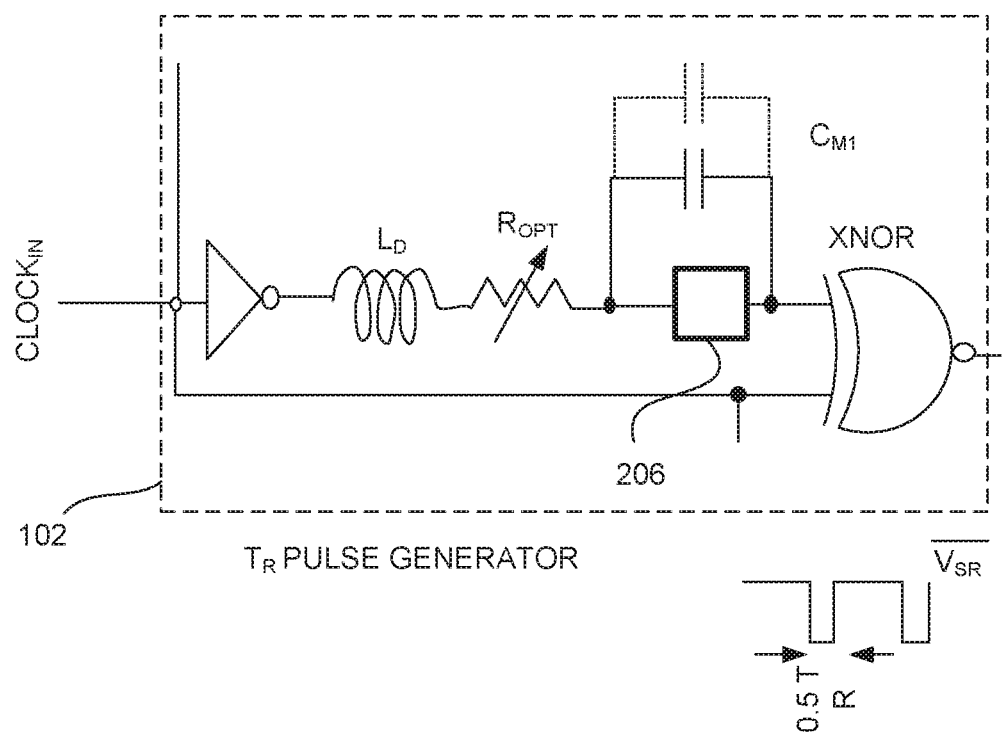
FIG. 2 illustrates an auto-calibration circuit of the pulse generator circuit of FIG. 1 according to an embodiment herein.

In this disclosure, inverter 106 in FIG. 1 is being replaced by a circuit which is capable of calibrating the optimal pulse width across the PVT (process, voltage, temperature). FIG. 2 shows this circuit in block format, where block 206 corresponds to the circuit shown in FIG. 3.

Figure 3:
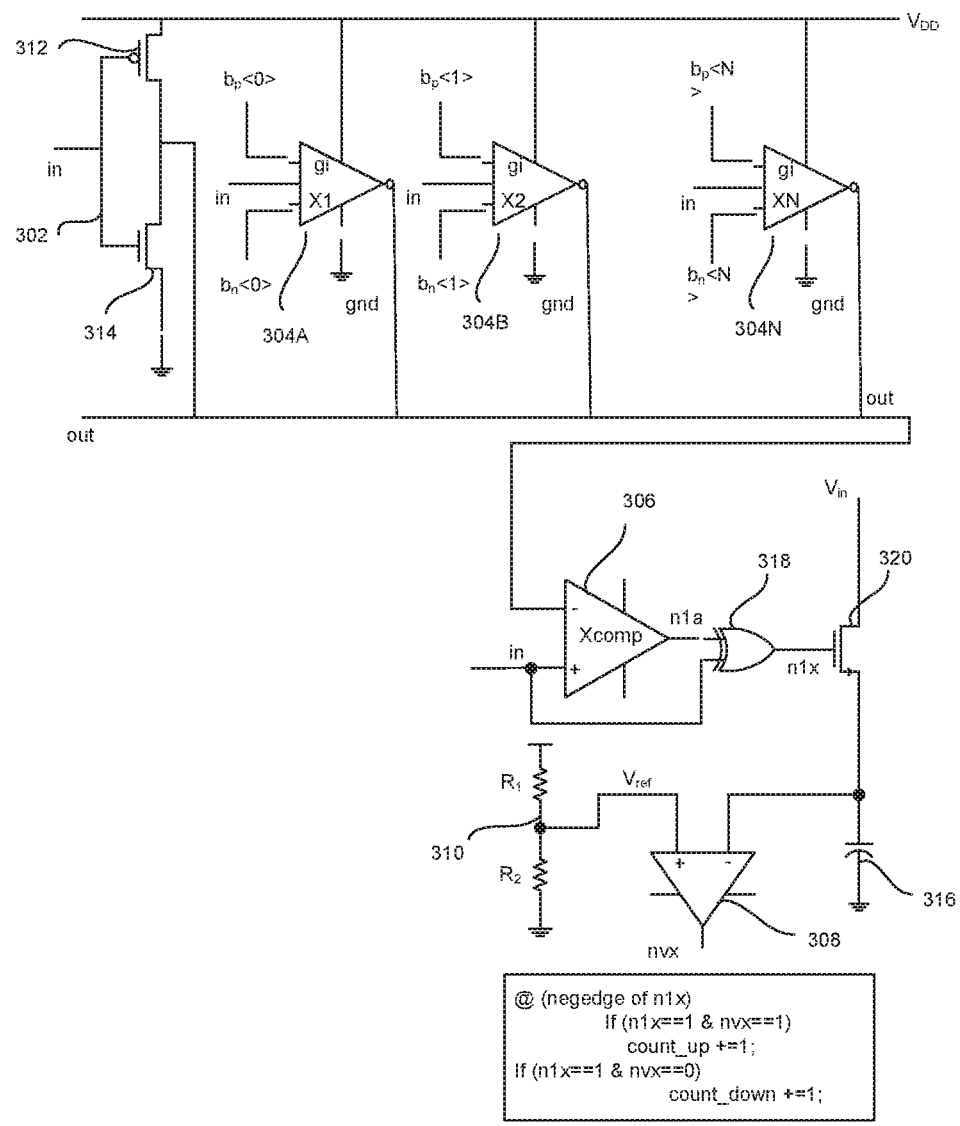
FIG. 3 illustrates an auto-calibration circuit of the pulse generator circuit shown in FIG. 1, according to an embodiment herein.

FIG. 3 illustrates a calibration circuit that is auto-calibrated to generate the precise pulses that are required for energy saving in the digital circuits according to an embodiment herein. The calibration circuit comprises one or more P-Channel Metal Oxide Semiconductor (PMOS), one or more N-Channel Metal Oxide Semiconductor (NMOS), a resistance divider 310, comparators 306 and 308, capacitor 316, and corresponding hardware to the logic 317 shown in illustrative box 327. The resistance divider 310 includes one or more resistors (e. g. a resistor R1 and a resistor R2). Comparator 308 obtains a first input from a mid-point or a reference point voltage of the resistor divider 310 and a second input from the capacitor 316. The capacitor 316 samples the input voltage (node 302) when the output of the XOR 318 is high.

The values of the resistors are arbitrary so that the ratio of R1 and R2 could be set to choose a particular trip voltage (also called threshold voltage). In an embodiment, the calibration circuit is Process, Voltage and Temperature (PVT) independent. In an embodiment, the auto-calibration circuit replaces the inverter 106 which is connected with one of the input terminals of the XOR gate present in the pulse generator circuit.

FIG. 3 further illustrates an auto-calibration circuit of the pulse generator circuit shown in FIG. 1 according to an embodiment herein. The circuit includes an inverter comprised of transistor 312 and transistor 314, one or more gated inverters 304A-304N, a first comparator 306, a second comparator 308 and a voltage divider circuit 310. The inverter comprised of transistor 312 and transistor 314 includes a PMOS 312 and a NMOS 314 that are connected together. The one or more gated inverters are connected together parallel with the inverter comprised of transistor 312 and transistor 314. The one or more gated inverters obtain the input bits $B_p$ and $B_n$. In an embodiment, the PMOS of the one or more gated inverters 304A-304N are connected in parallel to the inverter comprised of transistor 312 and transistor 314 when the input bit ($B_p$) of the one or more gated inverters 304A-304N is high. A NMOS of the one or more gated inverters 304A-304N are connected in parallel to the inverter comprised of transistor 312 and transistor 314 when the input bit ($B_n$) of the one or more gated inverters 304A-304N is high. The first comparator 306 obtains one of its inputs from at least one of the inverter comprised of transistor 312 and transistor 314 and the one or more gated inverters 304A-304N. In an embodiment, an XOR gate 318 is connected with the first comparator 306 to generate the output n1x. The second comparator 308 obtains one of its inputs from the voltage divider circuit 310. In an embodiment, a capacitor 316 is connected with the second comparator 308 to provide the input. The capacitor 316 gets charged when n1x is high using a NMOS 320. In an embodiment, the number of one or more gated inverters 304A-304N is determined based on the requirement to cover a dynamic range of the auto-calibration circuit. In an embodiment, the dynamic range is nearly Vdd or equal to Vdd. In another embodiment, a (variable) dynamic range can range from Vdd to less than Vdd. In yet another embodiment, the dynamic range is set to be between zero and Vdd. Now, the count value of the pmos-counter enables the number of PMOS transistors of gated inverters 304A-304N. The count value of the nmos-counter enables the number of NMOS transistors in gated inverters 304A-304N. A pulse generator's pmos-counter increases its count when the output of the XOR 318 (following comparator 306) and comparator 308 are both high (i.e., 1 or logic one). The pulse generator's nmos-counter increases its value when the output of the XOR 318 (following comparator 306) is high and the output of comparator 308 is low (i.e. 0, or logic zero).

Figure 4:
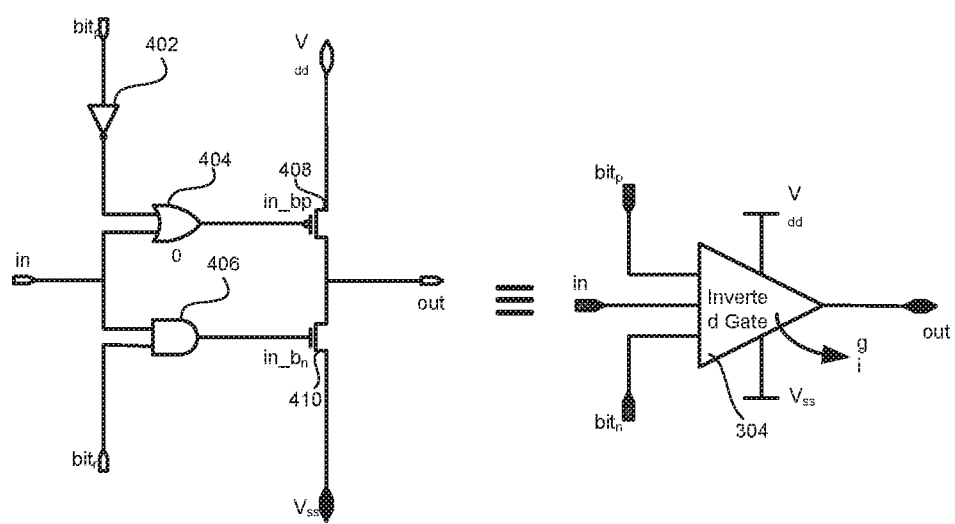
FIG. 4 illustrates an exploded view of a gated inverter of FIG. 3 according to an embodiment herein.

FIG. 4 illustrates an exploded view of a gated inverter of FIG. 3 according to an embodiment herein. The gated inverters 304A-304N includes an inverter 402, an OR gate 404, an AND gate 406, a PMOS 408 and a NMOS 410.

Figure 5:
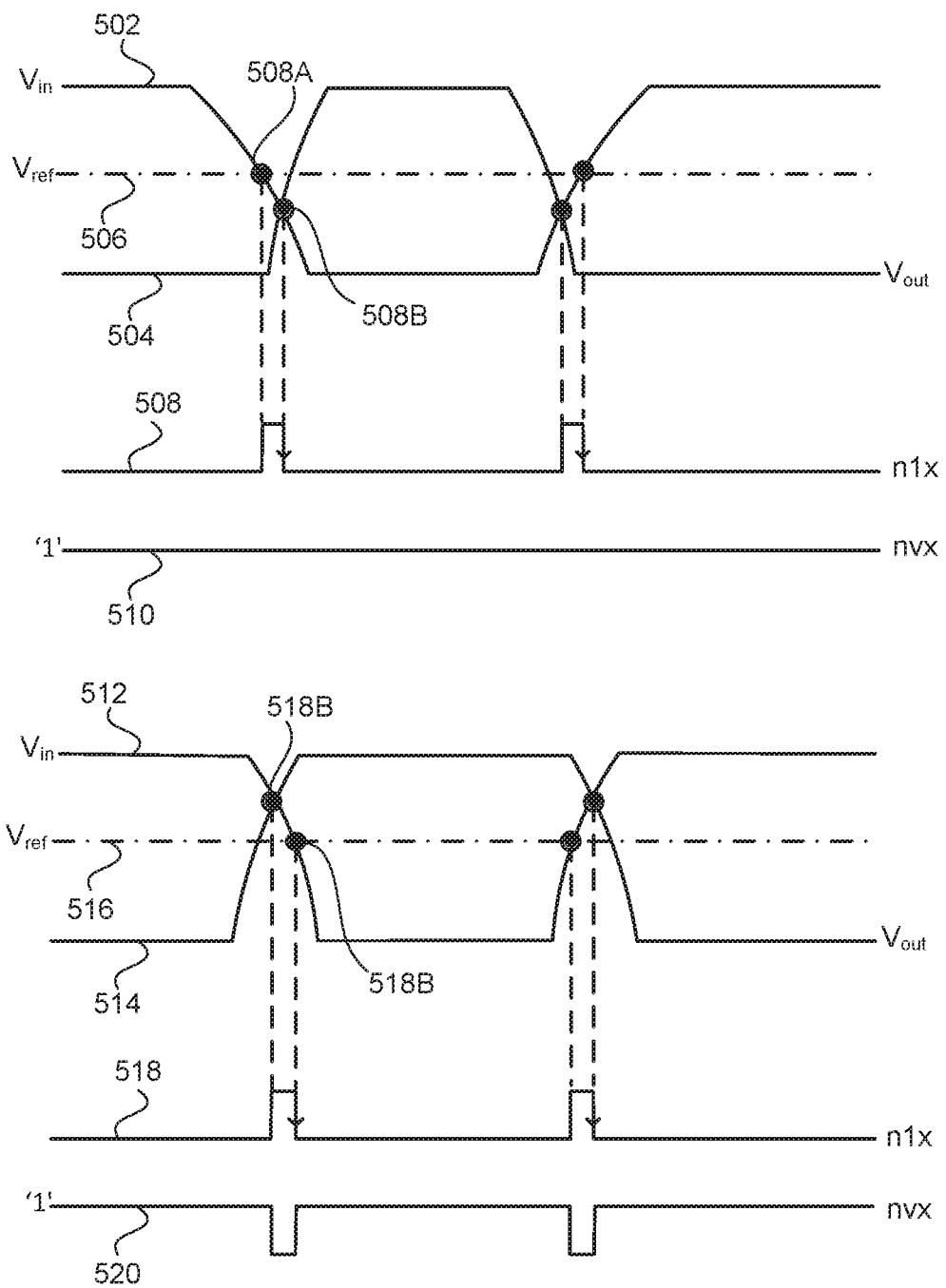
FIG. 5 represents the waveforms related to the calibration circuit shown in FIG. 3, according to an embodiment herein.

FIG. 5 represents the waveforms related to the calibration circuit shown in FIG. 3, according to an embodiment herein. The input voltage 502 (voltage at node 302 in FIG. 3) crosses the reference trip point at 508A, and the input waveform 502 and output waveform 504 cross at point 508B. The comparator and the XOR gate detects this timing difference between 508A and 508B, and this difference is shown as an output pulse of the XOR gate. The set of waveforms 508 and 510 shows the scenario where the pmos-counter is being increased and therefore increasing the number of PMOS transistors in parallel to the inverter (composed of transistor 312 and transistor 314) shifting the trip point to the target value. In another scenario, the set of waveforms 518 and 520, will cause the nmos-counter to increase, and therefore increase the number of NMOS transistors in parallel to the inverter (composed of transistor 312 and transistor 314) shifting the trip point to the target value. The description written in the logic box 316 describes the conditions fulfilled by the set of 508, 510, and the set of 518, 520 responsible for the pmos-counter and nmos-counter, respectively.

Figure 6:
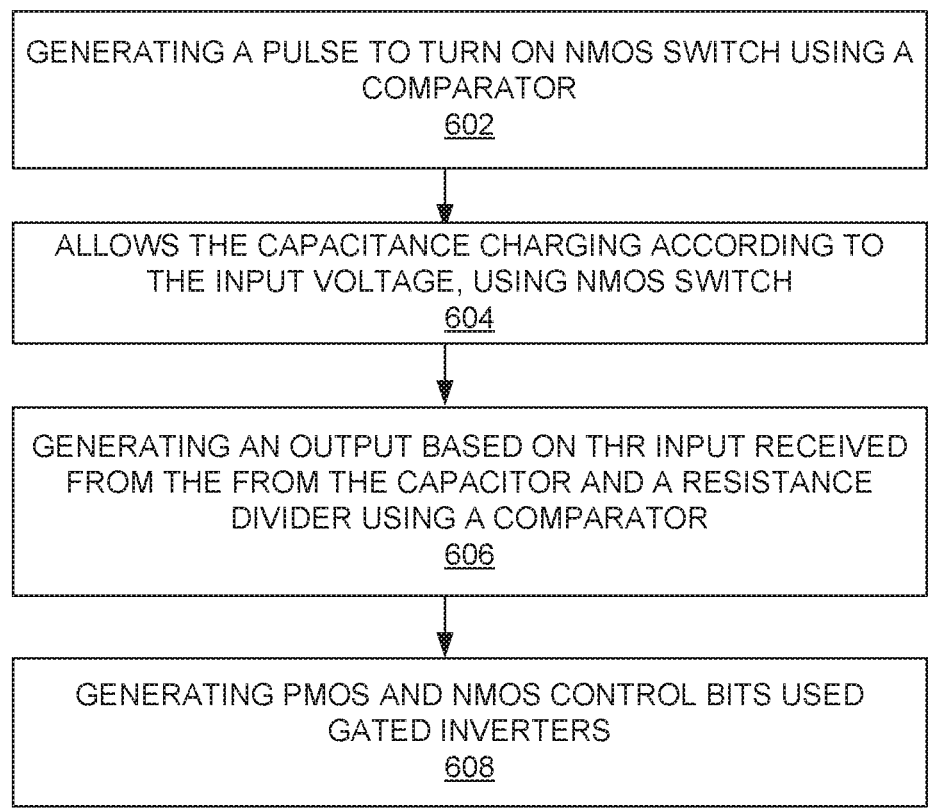
FIG. 6 is a flow diagram illustrates a method of calibrating using the auto-calibration circuit shown in FIG. 3 according to the embodiment herein.

FIG. 6 is a flow diagram which illustrates a method of calibrating the pulse widths of a pulse generator circuit across the PVT using the calibration circuit shown in FIG. 3, according to an embodiment herein. At step 602, a pulse is generated to turn on a NMOS switch 320 using a first comparator 318. At step 604, a capacitor 316 is allowed to charge based on an input signal using the NMOS switch 320. At step 606, a second comparator output (nvx) is generated based on the input received from the capacitor 316 and a resistance divider 310 using a second comparator 308. At step 608, control bits are generated using one or more gated inverters 304A-304N for calibrating the pulse widths of a pulse generator 102 increasing a count-down value when the XOR signal is high and the second comparator output is low using a PMOS counter and a NMOS counter.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the embodiments.

We claim:

1. An auto-calibration circuit for calibrating a circuit fabricated on Metal-Oxide Semiconductors (MOS) technology providing required calibration to improve the performance of the circuit, wherein said auto-calibration circuit comprises:

an inverter block that comprises a P-type Metal Oxide Semiconductor (PMOS) and a N-type Metal Oxide Semiconductor (NMOS);

one or more gated inverters that obtain first inputs $B_n$ and $B_p$ from Digital Memory Counters of the circuit, wherein the one or more gated inverters comprises a plurality of PMOS and a plurality of NMOS;

a first comparator that is connected with the one or more gated inverters that obtains a second input from at least one of the inverter block or the one or more gated inverters;

a NMOS gate that is connected with a capacitor and an XOR gate to charge the capacitor using a XOR signal (n1x) from the XOR gate, wherein the XOR gate generates the XOR signal when the XOR gate is connected with the first comparator;

a second comparator that obtains input from at least one of a voltage divider or a capacitor;

a PMOS counter that increases the count values when output values of the second comparator and the XOR gate are high, wherein the count values of the PMOS counter enables the plurality of PMOS of the one or more gated inverters; and a NMOS counter that increases the count values when the output value of the second comparator is low and the output value of the XOR gate is high, wherein the count values of the NMOS counter enables the plurality of NMOS of the one or more gated inverters to provide required calibration to the circuit.

2. The circuit as claimed in claim 1, wherein the plurality of PMOS is connected with the inverter block when the input $B_p$ is high.

3. The circuit as claimed in claim 1, wherein the plurality of NMOS is connected with the inverter block when the input $B_p$ is high.

4. The circuit as claimed in claim 1, wherein a voltage divider comprises a first resistor and a second resistor, wherein the ratio between the first resistor and the second resistor is selected based on a threshold voltage which is used to provide the required calibration.

5. The circuit as claimed in claim 1, wherein the one or more gated inverters comprises a NOT, a NOR gate, a NAND gate, a gated PMOS and a gated NMOS, wherein the one or more inverter obtains the first input $B_p$ using the NOT gate and the first input $B_n$ using the NAND gate.

6. The circuit as claimed in claim 1, wherein the one or more gated inverters are connected with the inverter block.

7. The circuit as claimed in claim 1, wherein the capacitor samples the input voltage when the XOR signal is high.

8. The circuit as claimed in claim 1, wherein the second comparator generates a second comparator output and the XOR gate generates the XOR signal, wherein the PMOS counter and the NMOS counter increases the count-up value when the XOR signal and the second comparator output is high, wherein the PMOS counter and the NMOS counter increases the count-down value when the XOR signal is high and the second comparator output is low.

9. A method for calibrating the pulse widths of a pulse generator circuit using auto-calibration circuit, the method comprising generating a pulse to turn on a NMOS switch using a first comparator;

allowing a capacitor to charge based on an input signal using the NMOS switch;

generating a second comparator output based on the input received from the capacitor and a resistance divider using a second comparator;

generating a set of control bits based on the second comparator output (nvx);
using the set of control bits to selectively control a set of one or more gated inverters, where the set of one or more gated inverters is connected in parallel across a shared supply voltage and a shared gated inverter output;
where the shared gated inverter output affects the timing of the output of the first comparator;
where the shared gated inverter output affects the timing of the output of the second comparator;
for calibrating the pulse widths of a pulse generator.

10. The method as claimed in claim 9, wherein the method comprises
generating a XOR signal using a XOR gate;
increasing a count-up value when the XOR signal and the second comparator output is high using a PMOS counter and a NMOS counter; and
increasing a count-down value when the XOR signal is high and the second comparator output is low using a PMOS counter and a NMOS counter.

\* \* \* \* \*